(12) United States Patent
Shih

(10) Patent No.: US 11,640,945 B2
(45) Date of Patent: May 2, 2023

(54) METHOD OF FORMING A SEMICONDUCTOR STRUCTURE INCLUDING FORMING A BUFFER STRUCTURE OVER A METAL LAYER

(71) Applicant: NANYA TECHNOLOGY CORPORATION, New Taipei (TW)

(72) Inventor: Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/643,176

(22) Filed: Dec. 7, 2021

(65) Prior Publication Data
US 2022/0102290 A1 Mar. 31, 2022

Related U.S. Application Data

(62) Division of application No. 16/860,041, filed on Apr. 27, 2020, now Pat. No. 11,322,458.

(51) Int. Cl.
*H01L 23/48* (2006.01)
*H01L 23/00* (2006.01)
*H01L 21/768* (2006.01)

(52) U.S. Cl.
CPC ...... *H01L 23/562* (2013.01); *H01L 21/76852* (2013.01); *H01L 21/76898* (2013.01); *H01L 23/481* (2013.01); *H01L 24/13* (2013.01); *H01L 24/32* (2013.01); *H01L 24/83* (2013.01); *H01L 2224/13025* (2013.01); *H01L 2224/32145* (2013.01); *H01L 2224/83896* (2013.01); *H01L 2924/351* (2013.01)

(58) Field of Classification Search
CPC ............. H01L 23/562; H01L 23/481; H01L 21/76852; H01L 21/76898; H01L 2224/13025; H01L 2224/13; H01L 24/13; H01L 24/32; H01L 24/83; H01L 2224/32145; H01L 2224/83896
USPC .................................................. 257/621, 622
See application file for complete search history.

(56) References Cited

U.S. PATENT DOCUMENTS

| 7,655,495 B2 | 2/2010 | Adkisson et al. | |
| 8,003,517 B2 | 8/2011 | Mathew et al. | |
| 8,957,526 B2 * | 2/2015 | Chun | H01L 24/03 257/774 |
| 2011/0108988 A1 * | 5/2011 | Lim | H01L 25/50 257/774 |
| 2011/0169122 A1 | 7/2011 | Oliver et al. | |
| 2013/0026599 A1 * | 1/2013 | Nakamura | H01L 24/14 257/508 |
| 2013/0075905 A1 * | 3/2013 | Choi | H01L 25/0657 257/738 |

(Continued)

*Primary Examiner* — Khiem D Nguyen
(74) *Attorney, Agent, or Firm* — CKC & Partners Co., LLC

(57) ABSTRACT

A method of forming a semiconductor structure includes following steps. A first substrate and a second substrate are bonded together, in which the first substrate has a landing pad. The second substrate is etched to form an opening, in which the landing pad is exposed through the opening. A metal layer is formed over the landing pad and a sidewall of the second substrate that surrounds the opening. A buffer structure is formed over the metal layer. The buffer structure is etched such that a top surface of the buffer structure is below a top surface of the metal layer. A barrier structure is formed over metal layer and the buffer structure.

5 Claims, 15 Drawing Sheets

(56) References Cited

U.S. PATENT DOCUMENTS

| | | |
|---|---|---|
| 2014/0124929 A1 | 5/2014 | Lin et al. |
| 2014/0264869 A1* | 9/2014 | Huang .................... H01L 24/06 |
| | | 257/774 |
| 2015/0255410 A1 | 9/2015 | Filippi et al. |
| 2016/0268182 A1 | 9/2016 | Lee et al. |
| 2017/0186659 A1* | 6/2017 | Moon ................. H01L 21/6835 |
| 2017/0358518 A1* | 12/2017 | Wu ......................... H01L 21/78 |
| 2019/0074220 A1* | 3/2019 | Zhang ............... H01L 21/76879 |
| 2019/0386051 A1 | 12/2019 | Hong et al. |

* cited by examiner

METHOD OF FORMING A SEMICONDUCTOR STRUCTURE INCLUDING FORMING A BUFFER STRUCTURE OVER A METAL LAYER

CROSS-REFERENCE TO RELATED APPLICATION

This application is a Divisional Application of the U.S. application Ser. No. 16/860,041, filed on Apr. 27, 2020, issued as U.S. Pat. No. 11,322,458, the entirety of which is incorporated by reference herein in their entireties.

BACKGROUND

Technical Field

The present disclosure relates to a method of forming the semiconductor structure.

Description of Related Art

With the rapid growth of electronic industry, the development of integrated circuits (ICs) has achieved high performance and miniaturization. Technological advances in IC materials and design have produced generations of ICs where each generation has smaller and more complex circuits than the previous generation.

As the number of electronic devices on single chips rapidly increases, three-dimensional (3D) integrated circuit layouts, or stacked chip designs, have been utilized for certain semiconductor devices in an effort to overcome the feature size and density limitations associated with 2D layouts. Generally, in a 3D IC design, two or more semiconductor dies are bonded together, and electrical connections are formed between each die. One method of facilitating the chip-to-chip electrical connections is by using through-silicon vias (TSVs). A TSV is a vertical electrical connection that passes through a silicon wafer or die, allowing for more simplified interconnection of vertically aligned electronic devices, thereby significantly reducing integrated circuit layout complexity as well as overall dimensions of a multi-chip circuit. Some of the benefits associated with the interconnect technology enabled by 3D IC designs include accelerated data exchange, reduced power consumption, and much higher input/output voltage densities. However, a stress problem may occur between the through silicon vias and the semiconductor dies.

SUMMARY

One aspect of the present disclosure is a method of forming a semiconductor structure.

According to some embodiments of the present disclosure, a method of forming a semiconductor structure includes following steps. A first substrate and a second substrate are bonded together, in which the first substrate has a landing pad. The second substrate is etched to form an opening, in which the landing pad is exposed through the opening. A metal layer is formed over the landing pad and a sidewall of the second substrate that surrounds the opening. A buffer structure is formed over the metal layer. The buffer structure is etched such that a top surface of the buffer structure is below a top surface of the metal layer. A barrier structure is formed over metal layer and the buffer structure.

In some embodiments, the method of forming the structure further includes prior to etching the second substrate, forming a passivation layer over the second substrate.

In some embodiments, the method of forming the structure further includes etching the passivation layer to form an opening, in which the opening of the passivation layer is communicated to and wider than the opening of the second substrate.

In some embodiments, the method of forming the structure further includes prior to forming the metal layer, forming an isolation layer on the sidewall of the second substrate, such that the metal layer is formed over the isolation layer.

In some embodiments, the method of forming the structure further includes following steps. A first barrier is formed over the isolation layer and the landing pad. A second barrier layer is formed over the metal layer.

In some embodiments, etching the buffer structure is performed such that the top surface of the buffer structure is below a top surface of the second substrate.

In some embodiments, the method of forming the structure further includes forming a bump on the barrier structure.

In the aforementioned embodiments, since the buffer structure is in the second substrate and surrounded by the metal layer, the effect of compensating stress can be achieved. As a result, the performance of the semiconductor structure can be improved.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
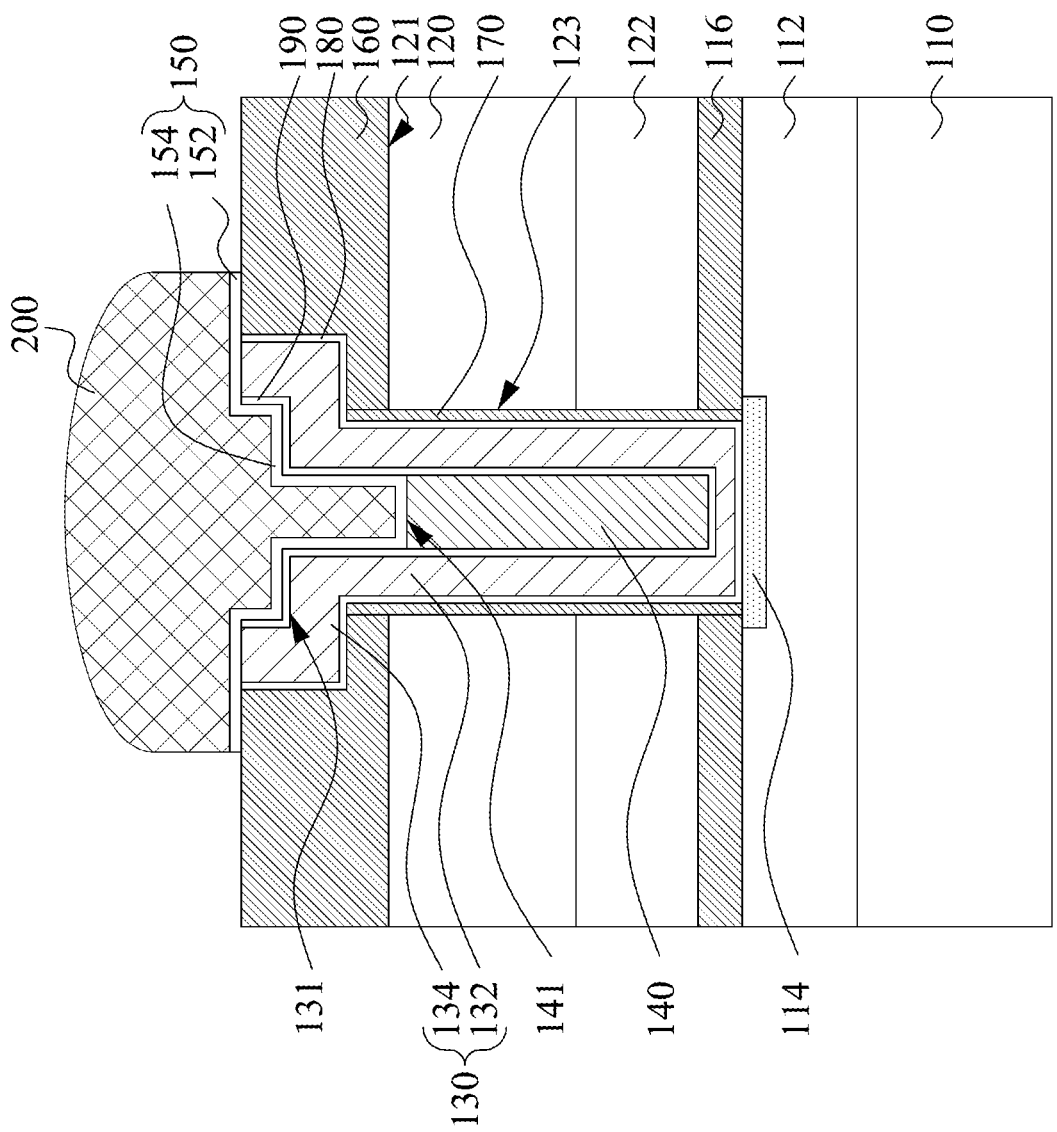
FIG. 1 is a cross-sectional view of a semiconductor structure in accordance with some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

FIG. 1 is a cross-sectional view of a semiconductor structure 100 in accordance with some embodiments of the present disclosure. Referring to FIG. 1, the semiconductor structure 100 includes a first substrate 110, a second substrate 120, a metal layer 130, a buffer structure 140, and a barrier structure 150. The first substrate 110 has a first interconnect structure 112 and a landing pad 114 thereon. The second substrate 120 is disposed over the first substrate 110. The metal layer 130 is disposed in the second substrate 120 and extends from the landing pad 114 to a top surface 121 of the second substrate 120. The buffer structure 140 is disposed in the second substrate 120 and surrounded by the metal layer 130, in which a top surface 141 of the buffer structure 140 is below a top surface 131 of the metal layer 130. The barrier structure 150 is disposed over the metal layer 130 and the buffer structure 140. Since coefficient of thermal expansion (CTE) is not matched between the metal layer 130 (e.g., copper in this case) and the second substrate 120 (e.g., silicon in this case), the buffer structure 140 is beneficial to compensate and balance the coefficient of thermal expansion (CTE) between the metal layer 130 and the second substrate 120. Accordingly, the effect of compensating stress can be achieved, and thus the performance of the semiconductor structure 100 can be improved. Further, the buffer structure 140 disposed over the metal layer 130 can eliminate the materials of the metal layer 130, such that the manufacturing cost can be decreased.

The landing pad 114 is disposed in the first interconnect structure 112. In some embodiments, the first interconnect structure 112 may include one or more active and/or passive devices. In other embodiments, the first interconnect structure 112 may include one or more metallization layers.

The second substrate 120 has a second interconnect structure 122. In some embodiments, the second interconnect structure 122 may include one or more active and/or passive devices. In other embodiments, the second interconnect structure 122 may include one or more metallization layers.

In some embodiments, each of the first substrate 110 and the second substrate 120 may be a silicon wafer. Alternatively, each of the first substrate 110 and the second substrate 120 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the first substrate 110 and the second substrate 120 may respectively include a dielectric layer 116 thereon. In greater details, the dielectric layer 116 is disposed between the first interconnect structure 112 of the first substrate 110 and the second interconnect structure 122 of the second substrate 120. In some embodiments, the dielectric layer 116 may include a single layer or multiple layers. The dielectric layer 116 may be made of silicon oxide ($SiO_2$), silicon nitride (SiN), silicon oxynitride (SiON), or other suitable materials.

In some embodiments, a passivation layer 160 is disposed over the second substrate 120. The passivation layer 160 may be made of silicon oxide ($SiO_2$), or other suitable materials.

In some embodiments, the barrier structure 150 has a first portion 152 over the passivation layer 160 and a second portion 154 on the metal layer 130 and the buffer structure 140. In other words, the barrier structure 150 covers the metal layer 130, the buffer structure 140, and a portion of the passivation layer 160, leaving the other portions of the passivation layer 160 exposed. In some embodiments, the barrier structure 150 is made of titanium (Ti), titanium nitride (TiN), tantalum (Ta), tantalum nitride (TaN), tungsten nitride (WN), tungsten silicide (WSi), or other suitable materials.

In some embodiments, the metal layer 130 has a first portion 132 and a second portion 134 on the first portion 132. The first portion 132 of the metal layer 130 is between the buffer structure 140 and the second substrate 120, and the second portion 134 of the metal layer 130 is between barrier structure 150 and the passivation layer 160. In some embodiments, the metal layer 130 is made of copper (Cu), or other suitable materials.

In some embodiments, an isolation layer 170 is disposed on a sidewall 123 of the second substrate 120. In other words, the isolation layer 170 is disposed between the second substrate 120 and the metal layer 130. The isolation layer 170 may extends from the dielectric layer 116 to the passivation layer 160. For example, a top surface of the isolation layer 170 is above the top surface 141 of the buffer structure 140. The isolation layer 170 may be made of silicon oxide ($SiO_2$), or other suitable materials. In some embodiments, the passivation layer 160 and the isolation layer 170 may be made of same materials, such as silicon oxide ($SiO_2$).

In some embodiments, the semiconductor structure 100 further includes a first barrier layer 180 and a second barrier layer 190. The first barrier layer 180 is disposed over the landing pad 114 and the isolation layer 170. In greater details, the first barrier layer 180 is disposed over the landing pad 114 and extends from the dielectric layer 116 to the passivation layer 160. In other words, the first barrier layer 180 is in contact with the landing pad 114, the metal layer 130, the isolation layer 170, and the passivation layer 160. The second barrier layer 190 is disposed over the metal layer 130. In other words, the second barrier layer 190 is disposed between the metal layer 130 and the buffer structure 140, and disposed between the metal layer 130 and the barrier structure 150.

In some embodiments, the buffer structure 140 is surrounded by the second barrier layer 190. The buffer structure 140 is in contact with the barrier structure 150 and the second barrier layer 190. In the present embodiment, the metal layer 130, the buffer structure 140, the first barrier layer 180, and the second barrier layer 190 may be referred as a through-silicon via. The top surface 141 of the buffer structure 140 is below to a top surface 121 of the second substrate 120. In some embodiments, the buffer structure 140 is made of an organic material.

In some embodiments, the semiconductor structure 100 further includes a bump 200 over the barrier structure 150. The barrier structure 150 is disposed between the bump 200 and the metal layer 130. In some embodiments, the bump 200 is a metal bump. The bump 200 may be made of tin (Sn), or other suitable conductive materials. For example, the bump 200 is a solder ball.

FIGS. 2-15 are cross-sectional views of a method of forming the semiconductor structure 100 of FIG. 1 at various stages in accordance with some embodiments of the present disclosure.

Figure 2:
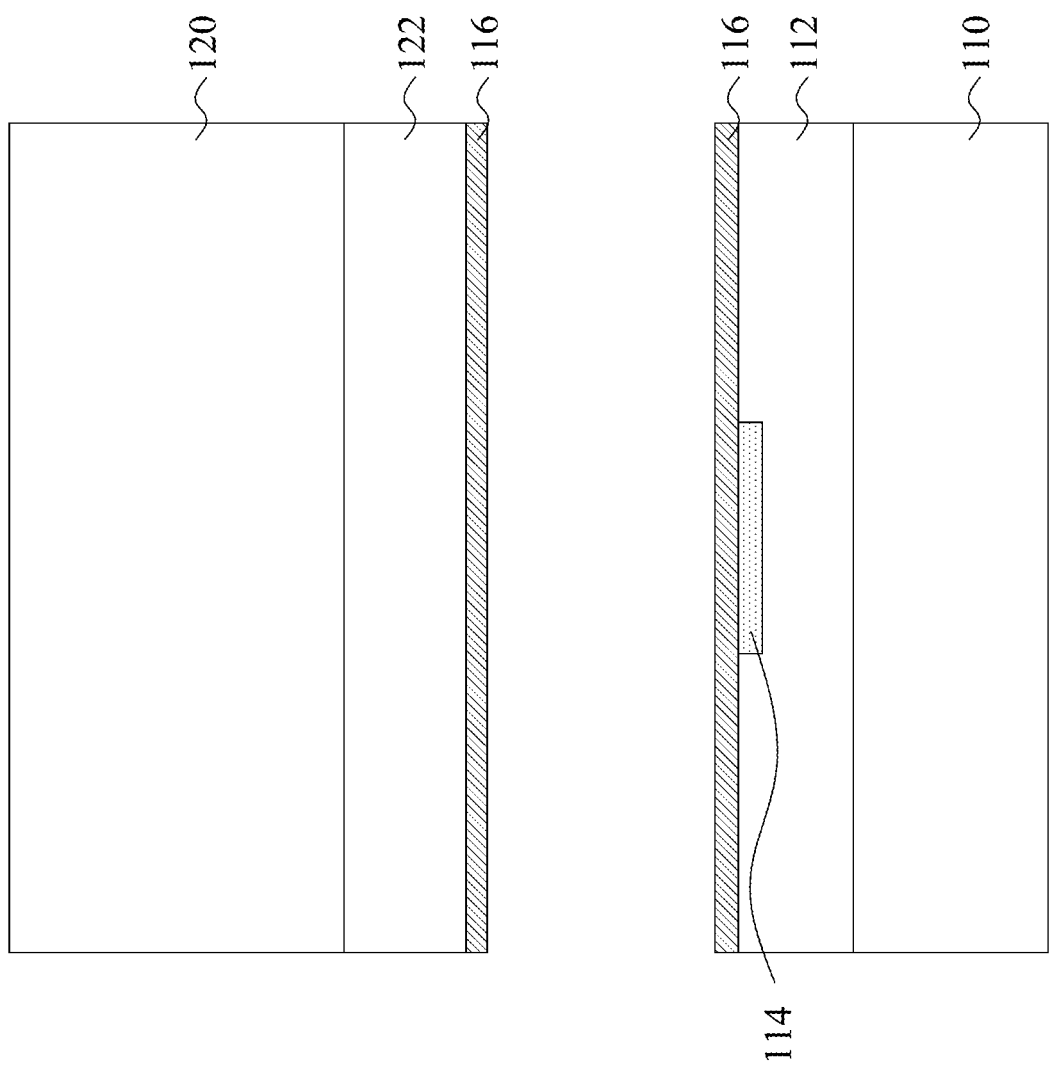
FIGS. 2-15 are cross-sectional views of a method of forming the semiconductor structure at various stages in accordance with some embodiments of the present disclosure.
Figure 3:
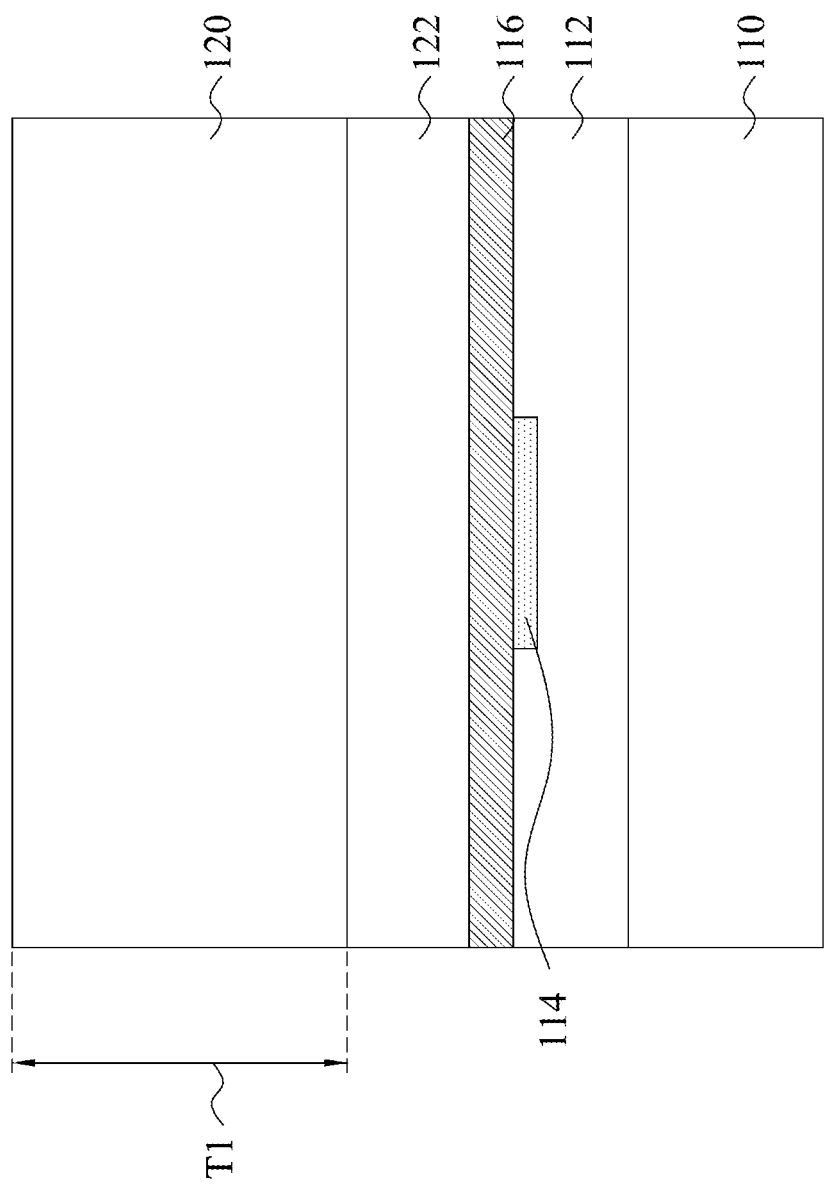

Referring to FIG. 2 and FIG. 3, the first substrate 110 and the second substrate 120 are bonded together. As shown in FIG. 3, after bonding the second substrate 120 on the first substrate 110, the dielectric layer 116 is between the first interconnect structure 112 and the second interconnect structure 122. The first substrate 110 and the second substrate 120 may be bonded together by using a fusion bonding technique.

Figure 4:
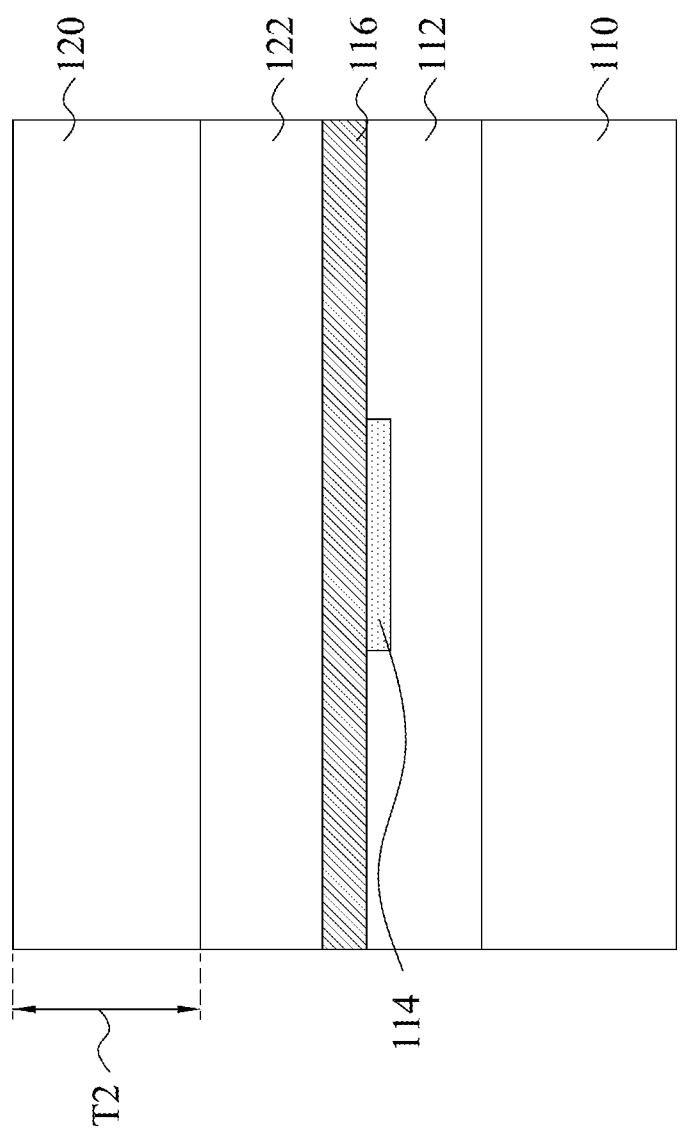

Referring to FIG. 3 and FIG. 4, after boing the first substrate 110 and the second substrate 120 together, the second substrate 120 is thinned. For example, a thickness T1 of the second substrate 120 in FIG. 3 is greater than a thickness T2 of the second substrate 120 in FIG. 4. In some embodiments, a grinding process is performed on a top surface of the second substrate 120 to thin the second substrate 120.

Figure 5:
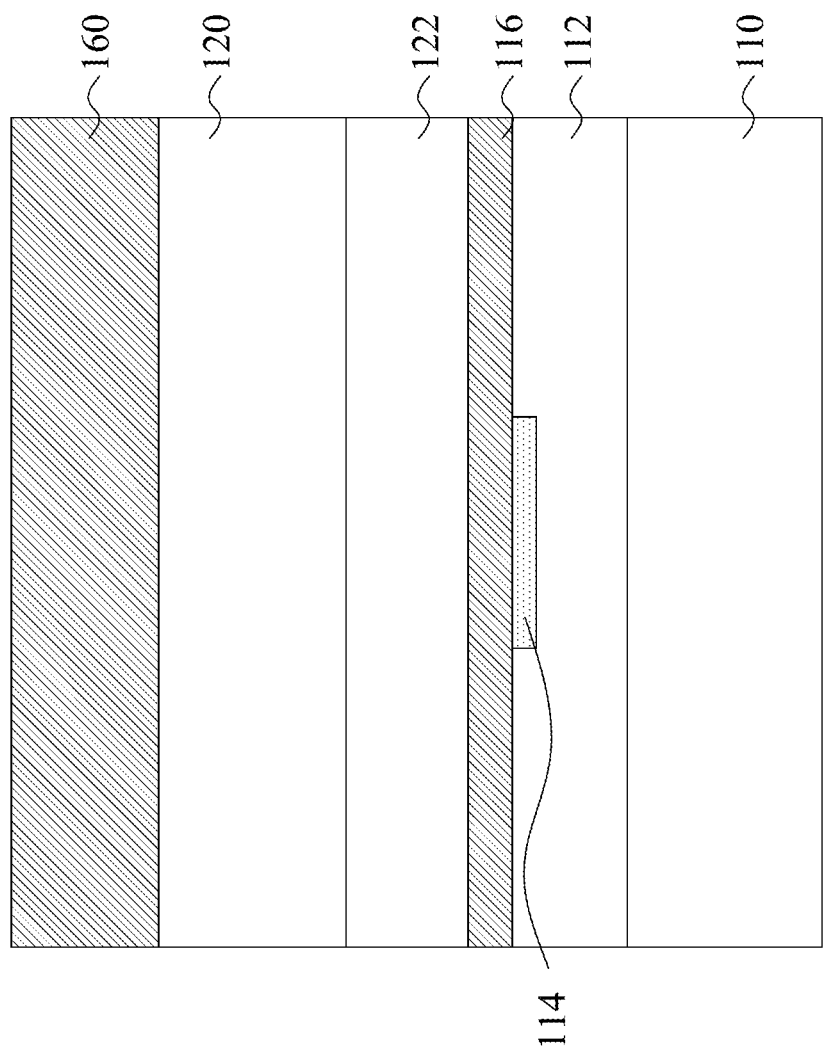

Referring to FIG. 5, the passivation layer 160 is formed over the second substrate 120. In greater details, the passivation layer 160 is deposited over the second substrate 120 by deposition techniques, such as chemical vapor deposition (CVD), physical vapor deposition (PVD), or other suitable techniques. In some embodiments, the passivation layer 160 may be made of organic materials, such as benzocyclobutene (BCB) or other suitable materials. In other embodiments, the passivation layer 160 may be made of inorganic materials, such as silicon oxide ($SiO_2$), silicon nitride (SiN), or other suitable materials. For example, the passivation layer 160 and the dielectric layer 116 are made of same materials.

Figure 6:
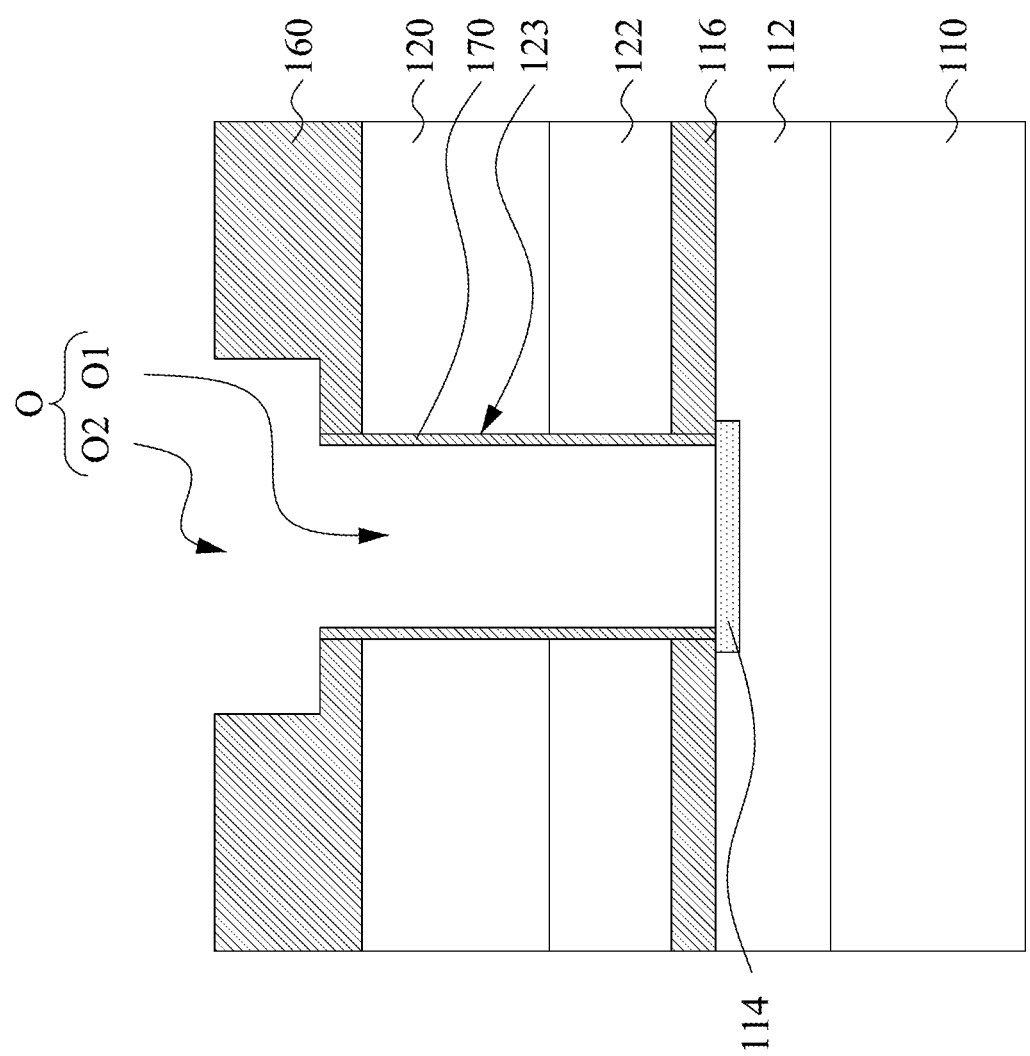

Referring to FIG. 6, after forming the passivation layer 160, the second substrate 120 and the passivation layer 160 are etched to form an opening O. In greater details, the opening O has an opening O1 and an opening O2 communicated to and wider than the opening O1. The second substrate 120 is etched to form the opening O1, and the landing pad 114 of the first substrate 110 is exposed through the opening O1. The passivation layer 160 is etched to form the opening O2, and a sidewall of the passivation layer is exposed through the opening O2. In some embodiments, the opening O1 and the opening O2 are formed by a damascene process. For example, a first patterned mask may be formed over the passivation layer 160, and then the passivation layer 160 is etched to form the opening O2 using the first patterned mask. Thereafter, a first patterned mask is removed and a second patterned mask is formed over the passivation layer 160. The passivation layer 160 and the second substrate 120 are etched to from the opening O2 communicated to the opening O1. In some embodiments, the second substrate 120 is etched to form the opening O1, such that the sidewall 123 of the second substrate 120 is exposed.

After the opening O1 and the opening O2 are formed, the isolation layer 170 is formed on the sidewall 123 of the second substrate 120. In greater details, the isolation layer 170 is formed over the passivation layer 160, the sidewall 123 of the second substrate 120, and the landing pad 114. In other words, the isolation layer 170 covers the passivation layer 160 and the landing pad 114. In some embodiments, the isolation layer 170 may be formed by physical vapor deposition (PVD), chemical vapor deposition (CVD), other suitable processes, or combinations thereof.

After the isolation layer 170 is formed, the isolation layer 170 over the passivation layer 160 and the landing pad 114 is removed, leaving the isolation layer 170 over the sidewall 123 of the second substrate 120 remained. In other words, the landing pad 114 is exposed through the opening O (the opening O1 and the opening O2).

Figure 7:
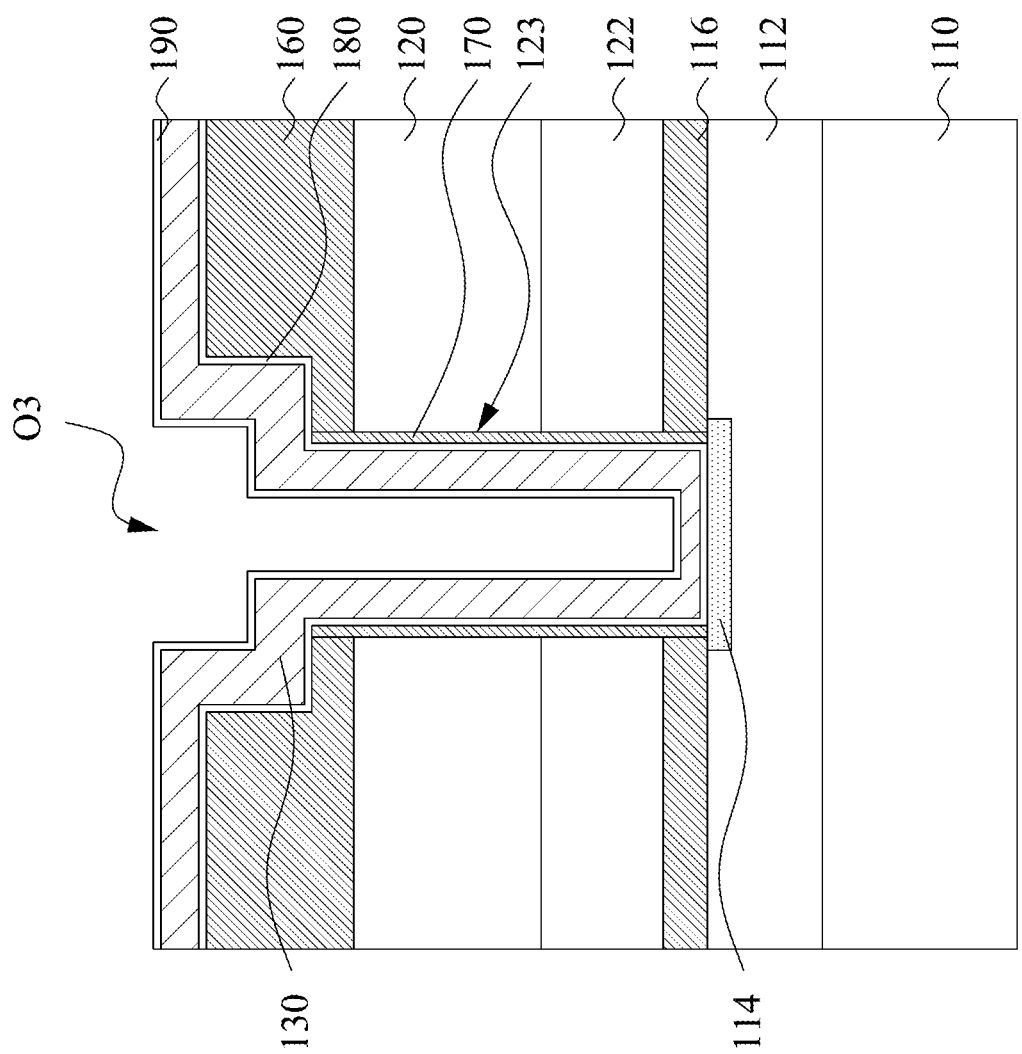

Referring to FIG. 7, the metal layer 130 is formed over the landing pad 114 and the sidewall 123 of the second substrate 120 that surrounds the opening O1. In greater details, the metal layer 130 is formed over the isolation layer 170. In some embodiments, before forming the metal layer 130, the first barrier layer 180 is formed over the isolation layer 170 and the landing pad 114. Thereafter, the metal layer 130 is conformally formed over the first barrier layer 180. In some embodiments, after the metal layer 130 is formed, the second barrier layer 190 is conformally formed over the metal layer 130.

In some embodiments, after the formation of the first barrier layer 180, the metal layer 130, and the second barrier layer 190, the size of the opening O in FIG. 6 is reduced to a remaining opening O3. In some embodiments, the first barrier layer 180 and the second barrier layer 190 may be made of same materials. For example, the first barrier layer 180 and the second barrier layer 190 may be made of titanium (Ti), titanium nitride (TiN), tantalum (Ta), tantalum nitride (TaN), tungsten nitride (WN), tungsten silicide (WSi), or other suitable materials.

Figure 8:
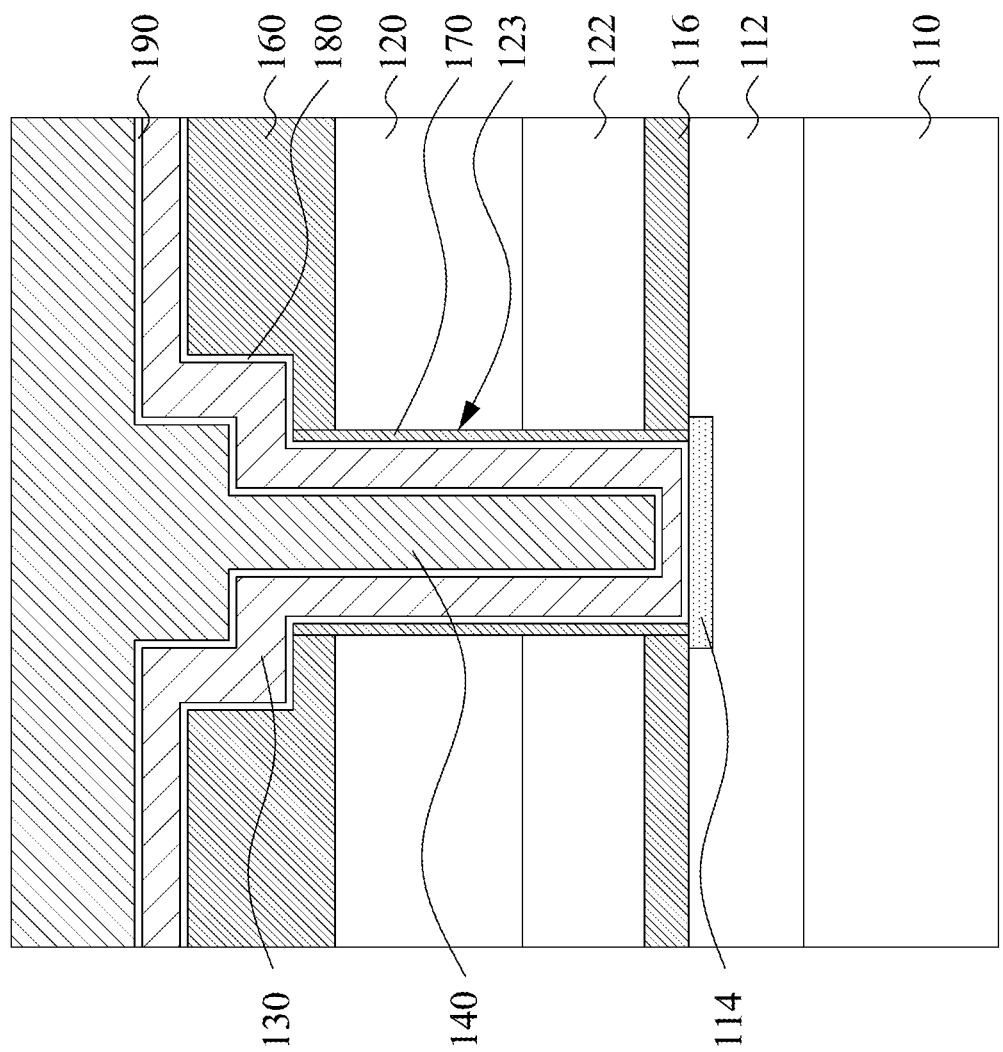

Referring to FIG. 7 and FIG. 8, the buffer structure 140 is formed over the metal layer 130. In other words, the remaining opening O3 is filled with the buffer structure 140. Stated differently, the buffer structure 140 covers the second barrier layer 190. In some embodiments, the buffer structure 140 is formed over the second barrier layer 190 by a spin-coating process, or other suitable processes. In some embodiments, the buffer structure 140 may be made of flowable organic materials, such as spin-on glasses (SOGs), spin-on dielectrics (SODs), or other suitable materials.

Figure 9:
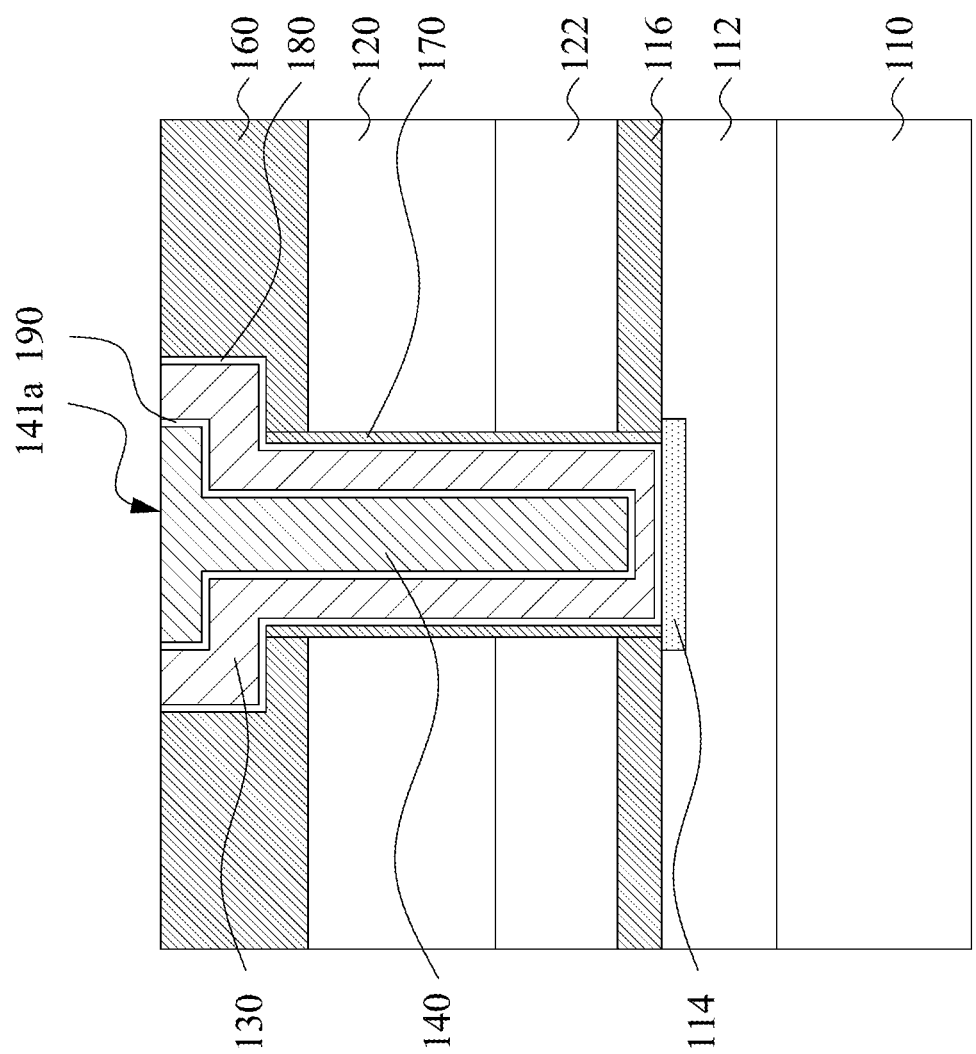

Referring to FIG. 9, a planarization process is performed to remove excess materials above the passivation layer 160. In greater details, a portion of the buffer structure 140, the second barrier layer 190, the metal layer 130, and the first barrier layer 180 are removed by the planarization process, such as a chemical mechanical polishing (CMP). After the planarization process is performed, a top surface 141a of the buffer structure 140 is exposed.

Figure 10:
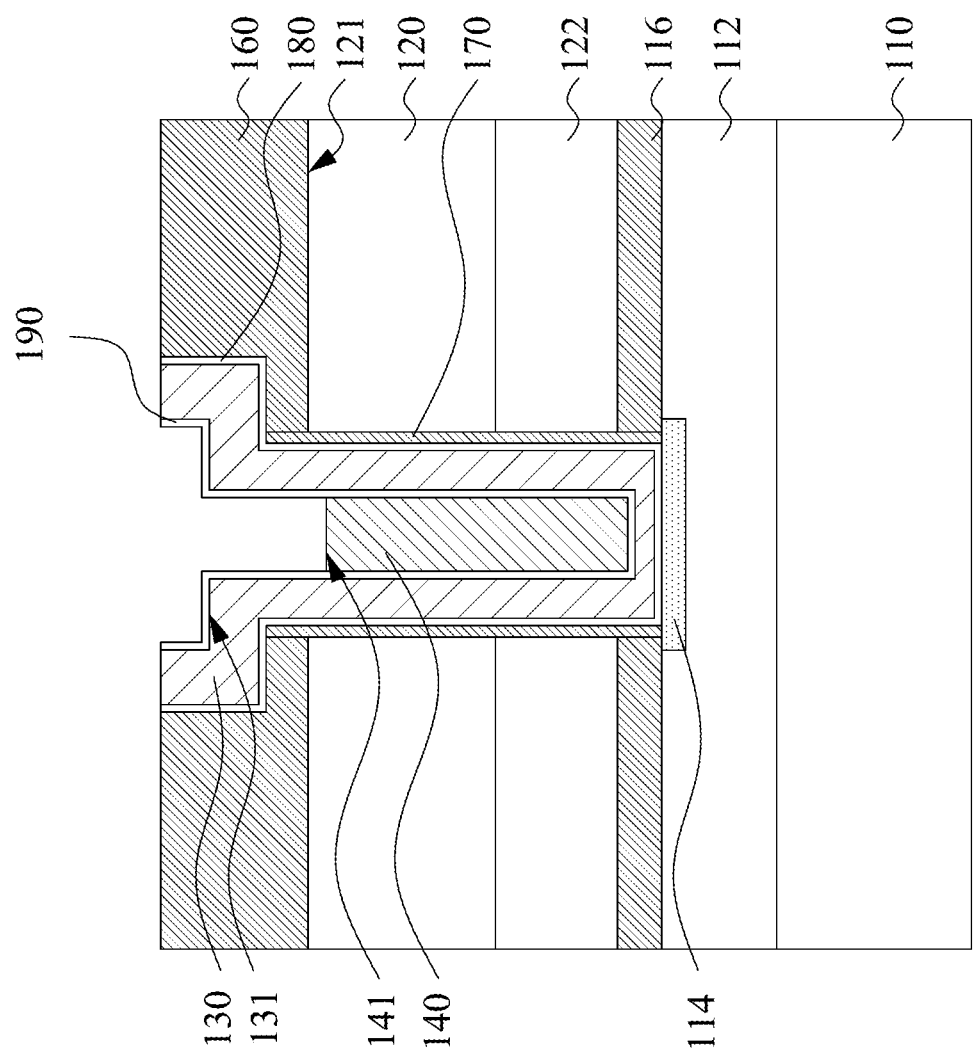

Referring to FIG. 10, the buffer structure 140 is etched such that the top surface 141 of the buffer structure 140 is below the top surface 131 of the metal layer 130. In other words, the top surface 141 of the buffer structure 140 in FIG. 10 is below the top surface 141a of the buffer structure 140 in FIG. 9. In some embodiments, the planarization process in FIG. 9 and the etching process in FIG. 10 are performed by using one etching process to planarize and etch back the buffer structure 140. In some embodiments, etching the buffer structure 140 is performed such that the top surface 141 of the buffer structure 140 is below the top surface 121 of the second substrate 120. As such, the contact area between the bump 200 (see FIG. 1) and the second barrier layer 190 can be increased in following processes.

Figure 11:
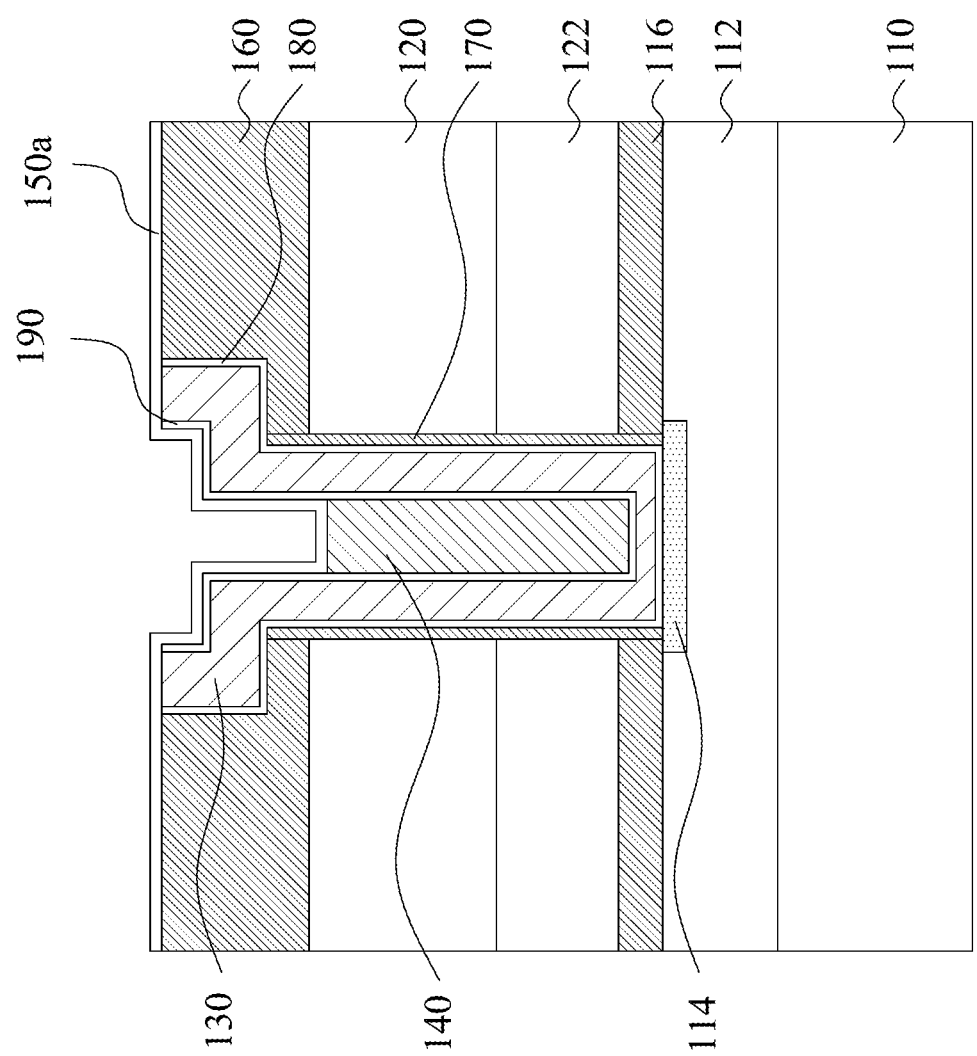

Referring to FIG. 11, a third barrier layer 150a is formed over the metal layer 130 and the buffer structure 140. In other words, the third barrier layer 150a covers the passivation layer 160, the first barrier layer 180, the metal layer 130, the second barrier layer 190, and the buffer structure 140. The third barrier layer 150a may be formed over the metal layer 130 and the buffer structure 140 by deposition techniques, such as chemical vapor deposition (CVD), physical vapor deposition (PVD), or other suitable techniques. In some embodiments, the first barrier layer 180, the second barrier layer 190, and the third barrier layer 150a may be made of same materials.

Figure 12:
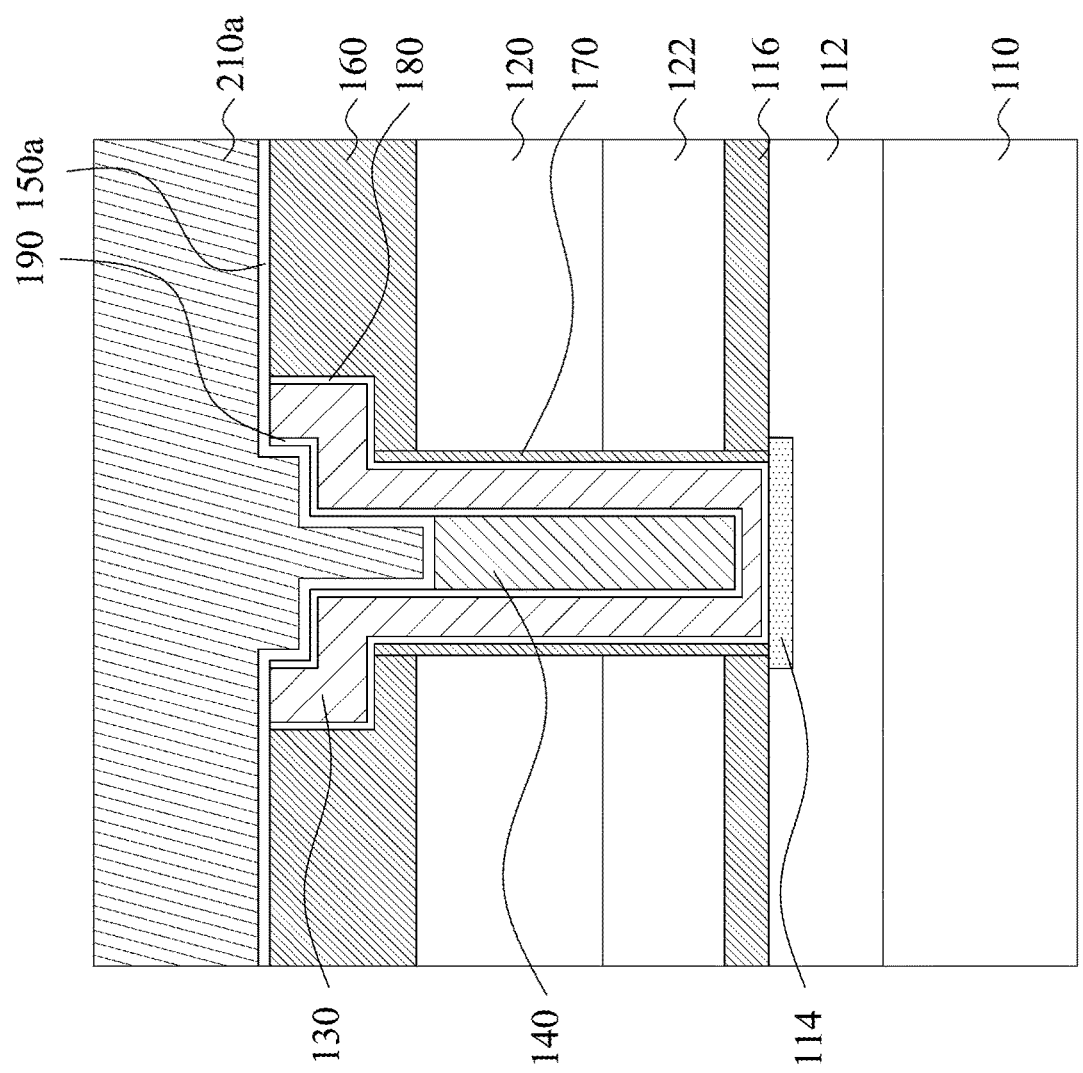

Referring to FIG. 12, a photoresist layer 210a is formed over third barrier layer 150a. In other words, the photoresist layer 210a is formed above the structure of FIG. 11. In some embodiments, the method of forming the photoresist layer 210a may include forming a plasma enhanced tetraethoxysilane (PETEOS) film over the third barrier layer 150a. In some embodiments, the photoresist layer 210a may include an organic material, such as a spin-on carbon (SOC) material, or other suitable materials.

Figure 13:
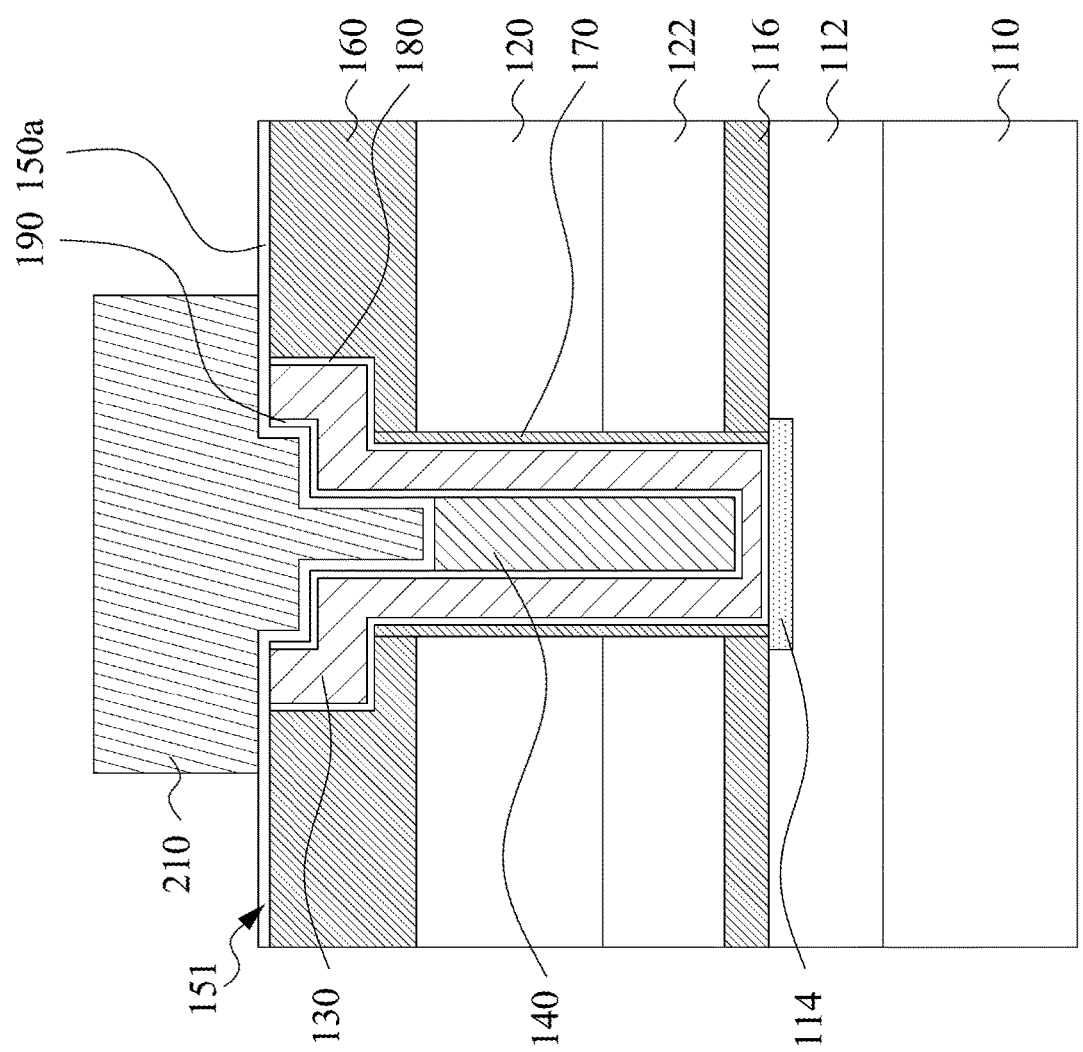

Referring to FIG. 12 and FIG. 13, the photoresist layer 210a is patterned to form a patterned mask feature 210, such that a portion 151 of the third barrier layer 150a not covered by the patterned mask feature 210 is exposed. The photoresist layer 210a may be patterned by using photolithography techniques.

Figure 14:
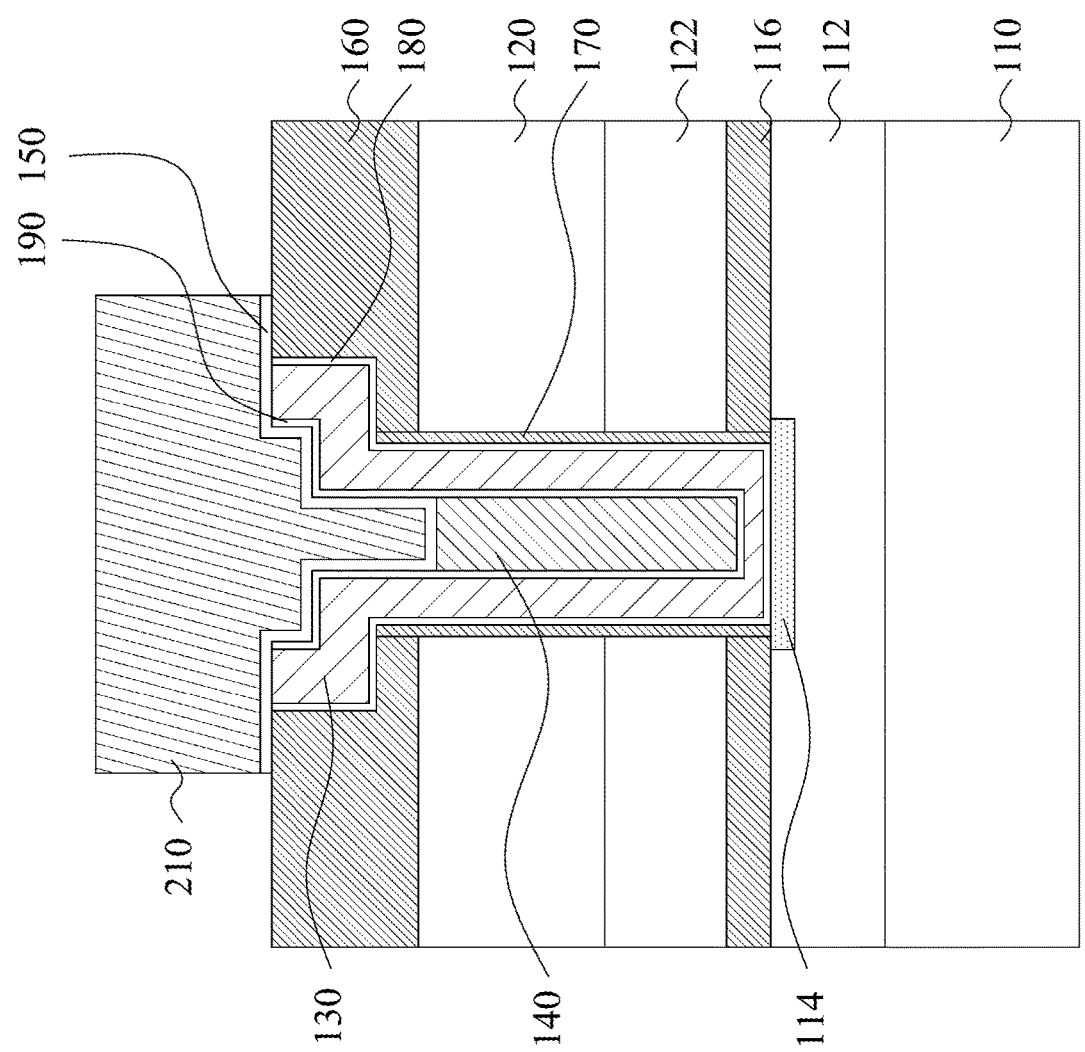

Referring to FIG. 13 and FIG. 14, the portion 151 of the third barrier layer 150a is etched to form the barrier structure 150 by using the patterned mask feature 210. This etching process results in the passivation layer 160 is exposed.

Figure 15:
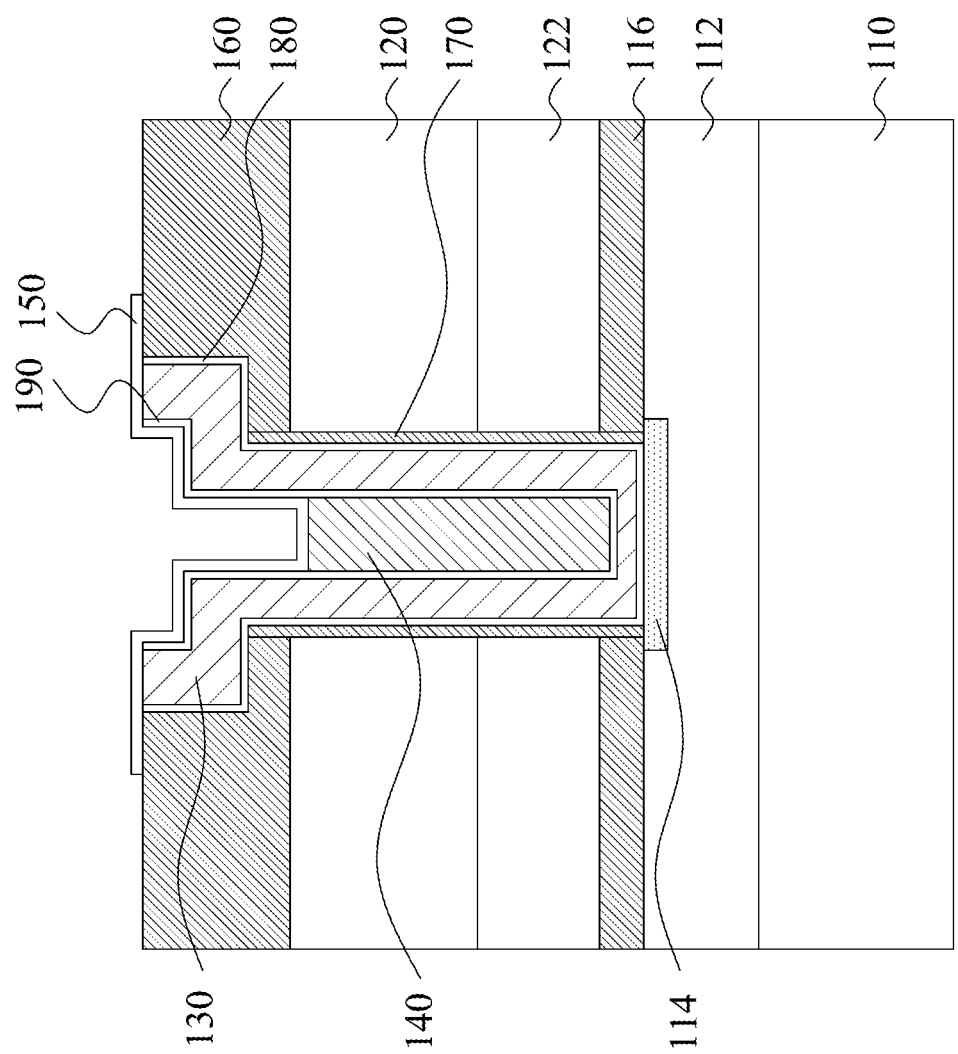

Referring to FIG. 14 and FIG. 15, the patterned mask feature 210 is removed. In some embodiments, removing the patterned mask feature 210 may be performed by using a photoresist strip process, such as an ashing process, and etching process, or other suitable processes.

Referring back to FIG. 1, after the patterned mask feature 210 of FIG. 14 is removed, the bump 200 is formed on the barrier structure 150. In greater details, the bump 200 may include a bottom portion and a top portion on the bottom portion, in which the bottom portion is surrounded by the metal layer 130, and the top portion protrudes from the passivation layer 160. The bump 200 may be formed by performing an electroless plating process. As a result, the semiconductor structure 100 as shown in FIG. 1 can be obtained.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of forming a semiconductor structure, comprising:
 bonding a first substrate and a second substrate together, wherein the first substrate has a landing pad;
 forming a passivation layer over the second substrate;
 after forming the passivation layer, etching the second substrate to form an opening, wherein the landing pad is exposed through the opening of the second substrate;
 etching the passivation layer to form an opening, wherein the opening of the passivation layer is communicated to and wider than the opening of the second substrate;
 forming a metal layer over the landing pad and a sidewall of the second substrate that surrounds the opening of the second substrate;
 forming a buffer structure over the metal layer;
 etching the buffer structure such that a top surface of the buffer structure is below a top surface of the metal layer; and
 forming a barrier structure over the metal layer and the buffer structure.

2. The method of forming the semiconductor structure of claim 1, further comprising:
 prior to forming the metal layer, forming an isolation layer on the sidewall of the second substrate, such that the metal layer is formed over the isolation layer.

3. The method of forming the semiconductor structure of claim 2, further comprising:
 forming a first barrier layer over the isolation layer and the landing pad; and
 forming a second barrier layer over the metal layer.

4. The method of forming the semiconductor structure of claim 1, wherein etching the buffer structure is performed such that the top surface of the buffer structure is below a top surface of the second substrate.

5. The method of forming the semiconductor structure of claim 1, further comprising:
 forming a bump on the barrier structure.

* * * * *